United States Patent [19]
Toda

[11] Patent Number: 5,893,167
[45] Date of Patent: *Apr. 6, 1999

[54] DATA TRANSFER CONTROL OF A VIDEO MEMORY HAVING A MULTI-DIVISIONAL RANDOM ACCESS MEMORY AND A MULTI-DIVISIONAL SERIAL ACCESS

[76] Inventor: Haruki Toda, 803, Heimat-Yokohama, 72-1, Sanya, Minami-Ku, Yokohama-shi, Kanagawa-ken, Japan

[*] Notice: The term of this patent shall not extend beyond the expiration date of Pat. No. 5,581,733.

[21] Appl. No.: 757,570

[22] Filed: Nov. 27, 1996

Related U.S. Application Data

[63] Continuation of Ser. No. 264,233, Jun. 22, 1994, Pat. No. 5,581,733, which is a continuation of Ser. No. 669,095, Mar. 13, 1991, abandoned.

[30] Foreign Application Priority Data

Mar. 13, 1990 [JP] Japan ..................................... 2-62035

[51] Int. Cl.$^6$ ..................................... G06F 12/02
[52] U.S. Cl. ........................... 711/165; 711/173; 345/517
[58] Field of Search ..................................... 395/436, 479, 395/492, 497.04, 891; 365/230.05, 230.09; 711/109, 152, 165, 173, 149; 345/509, 517

[56] References Cited

U.S. PATENT DOCUMENTS

| | | | |
|---|---|---|---|
| 4,747,081 | 5/1988 | Heilveil et al. | 365/219 |
| 4,757,473 | 7/1988 | Kurihara et al. | 365/189 |
| 4,800,530 | 1/1989 | Itoh et al. | 365/189 |
| 4,811,305 | 3/1989 | Watanabe et al. | 365/239 |
| 4,812,836 | 3/1989 | Kurakake et al. | 345/121 |
| 4,825,411 | 4/1989 | Hamano | 365/189 |
| 4,930,108 | 5/1990 | Sugiyama | 365/230.02 |
| 4,970,642 | 11/1990 | Yamamura | 364/200 |
| 5,001,672 | 3/1991 | Ebbers et al. | 365/230.05 |
| 5,065,368 | 11/1991 | Gupta et al. | 365/230.05 |
| 5,065,369 | 11/1991 | Toda | 365/230.05 |
| 5,075,887 | 12/1991 | Magome et al. | 365/222 |
| 5,097,447 | 3/1992 | Ogawa et al. | 365/200 |
| 5,142,637 | 8/1992 | Harlin et al. | 395/425 |
| 5,157,775 | 10/1992 | Sanger | 395/425 |
| 5,157,776 | 10/1992 | Foster | 395/425 |
| 5,170,157 | 12/1992 | Ishii | 711/109 |
| 5,179,372 | 1/1993 | West et al. | 340/799 |
| 5,179,687 | 1/1993 | Hidaka et al. | 395/425 |
| 5,283,866 | 2/1994 | Kumagai | 395/164 |
| 5,329,489 | 7/1994 | Diefendorff | 365/189.05 |

*Primary Examiner*—Eddie P. Chan
*Assistant Examiner*—Gary J. Portka
*Attorney, Agent, or Firm*—Foley & Lardner

[57] ABSTRACT

An image memory has a random access memory array capable of being randomly accessed; a serial access memory array partitioned into n power of 2 (n>1) divisional areas cyclically and serially accessed in asynchronism with the random access memory; data transfer unit for transferring data between the random access memory array and the serial access memory array; a determining unit for determining a row of data to be transferred from the random access memory array to each of the divisional areas; and a designating unit for designating at least one of a top serial access address and a last serial access address respectively of each divisional area, wherein the data transfer unit executes data transfer from the random access memory array to the serial access memory array in accordance with outputs from the determining unit and the designating unit.

18 Claims, 8 Drawing Sheets

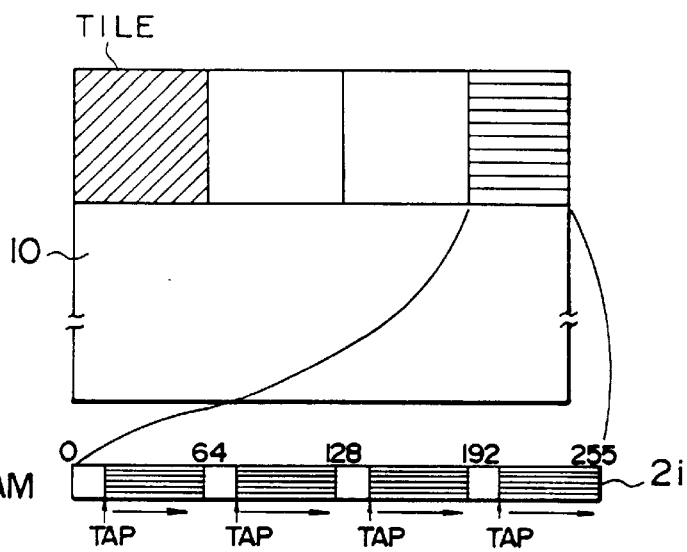
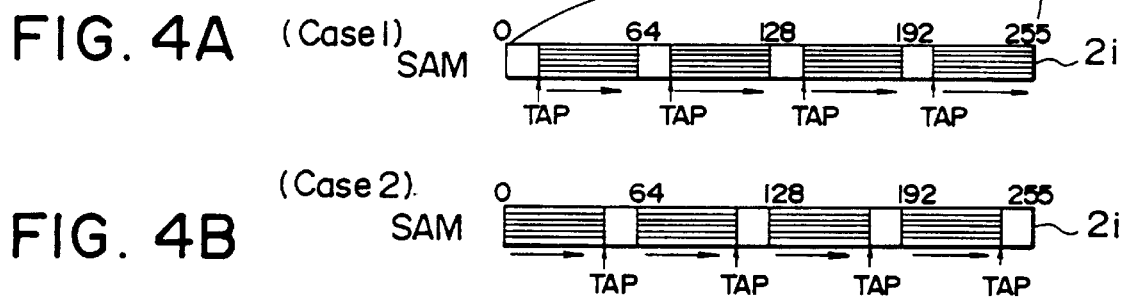
FIG. 4A (Case 1)
FIG. 4B (Case 2)
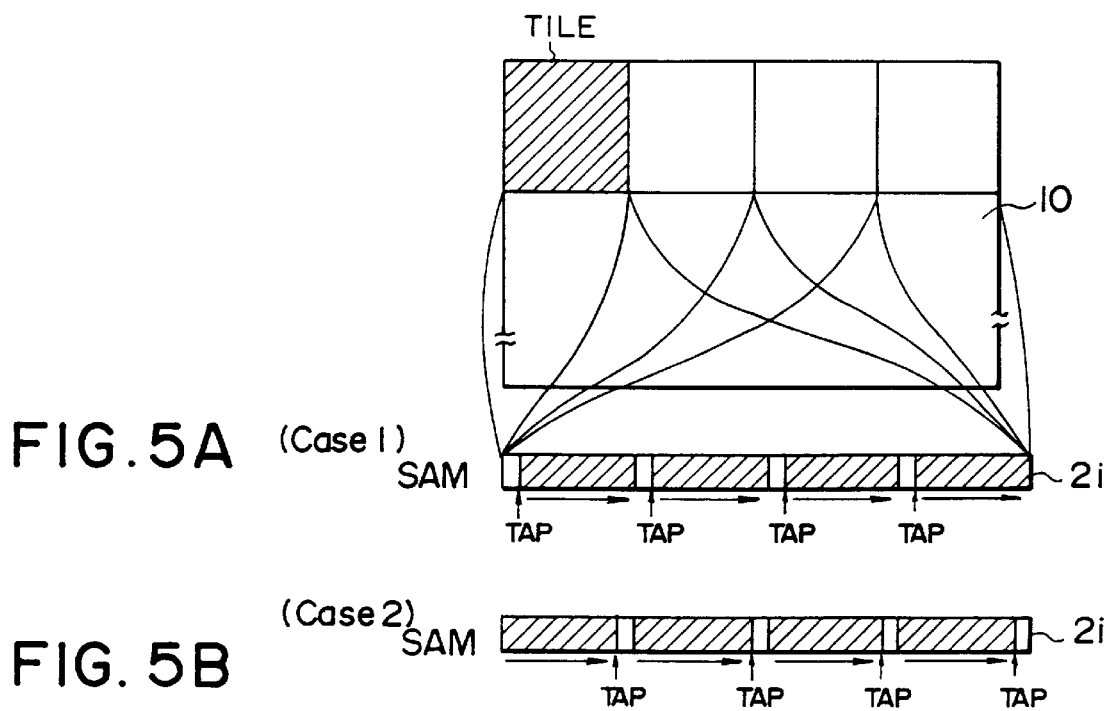
FIG. 5A (Case 1)
FIG. 5B (Case 2)

DATA TRANSFER CONTROL OF A VIDEO MEMORY HAVING A MULTI-DIVISIONAL RANDOM ACCESS MEMORY AND A MULTI-DIVISIONAL SERIAL ACCESS

This application is a continuation of application Ser. No. 08/264,233, filed Jun. 22, 1994, which is a continuation of Ser. No. 07/669,095 filed Mar. 13, 1991, now abandoned. The Ser. No. 08/264,233 application issued as U.S. Pat. No. 5,581,733 on Dec. 3, 1996.

BACKGROUND OF THE INVENTION

This invention relates to an image memory.

As memories suitable for high speed data processing in engineering work stations (EWSs) or computer graphics (CG), etc. and display associated therewith, attention in recent years is being drawn to dual port video random access memories (hereinafter referred to as DPRAMs). Such DPRAMs are provided with a random access port (hereinafter referred to as a RAM port "RAM" standing for random access memory) including a memory array accessible at random (e.g., a dynamic random access memory (DRAM), and a serial access port (hereinafter referred to as a SAM port "SAM" standing for serial access memory) including a serial access memory cyclically and serially accessed asynchronously with the RAM port. In such DPRAMs, since transfer of data is made between the RAM port and the SAM port, it is necessary that the timing at the RAM port and the timing at the SAM port be made synchronous with each other only at the time of this transfer cycle. The timings in this transfer cycle will be described with reference to FIGS. 6A and 6B. In the case of data transfer of a certain row R of a memory array 1 of the RAM port to a serial access memory 2 of the SAM port which is incessantly making a serial access (see FIG. 6A), a procedure is taken to produce a first external signal $\overline{DT}$ for controlling transfer (see time $T_1$ of FIG. 6B) fall. If the external signal $\overline{DT}$ is at "L" level at the time when the signal $\overline{RAS}$ falls, the operational mode enters the transfer cycle.

In this transfer cycle, in the same manner as that in an ordinary RAM cycle, a row address and a column address are given synchronously with falls of $\overline{RAS}$ and $\overline{CAS}$ (see times $T_2$ and $T_3$ of FIG. 6B), respectively. Unlike the ordinary RAM cycle, the row address indicates a row of the memory array 1 to be transferred, and the column address indicates a transfer address pointer (TAP) address serving as a position initiating a new serial cycle after completion of transfer. From the next serial cycle (see time $T_6$ of FIG. 6B) when the external signal $\overline{DT}$ has risen, transferred data is outputted with the TAP address being a leading address. It is necessary that the rise timing (time $T_5$) of the external signal $\overline{DT}$ be given for a time period from the rise (time $t_4$) of the serial clock signal SC to the next rise thereof (time $t_6$). Accordingly, there are restrictions in the time intervals $t_1$ (=$T_5-T_4$) and $t_2$ (=$T_6-T_5$). Furthermore, since the cycle time of the serial clock signal SC is 30 to 40 nsec, restrictions on the time intervals $t_1$ and $t_2$ are severe in application. To relax this, a split transfer system has been proposed.

This system is briefly described in NIKKEI ELECTRONICS No. 431, p. 126, Oct. 5, 1987.

This split transfer system will be described with reference to FIGS. 7A and 7B. The serial access memory 2 of the SAM port in which the split transfer system is used is split or divided into two sections of SAM (L) and SAM (U) as shown in FIG. 7A. These split SAM (L) and SAM (U) correspond to "0" and "1" of the most significant bit (hereinafter referred to as MSB) of the TAP address, respectively. Thus, independent data transfer can be made, respectively. The situation where a transfer cycle takes place when SAM (L) is subjected to serial access to carry out transfer of the row R of the memory array 1 of the RAM port will now be considered. In the same manner as in the case of FIG. 6A, the row address indicates the row R. The MSB of the TAP address is disregarded and is set to the MSB ("1" in this case) on the side where no serial access is conducted.

In this case, the SAM (U) on the side of the set MSB carries out the transfer operation. The transferred data is accessed from a TAP address where the MSB is newly set when serial access advances to shift from SAM (L) to SAM (U). In the case shown in FIGS. 7A and 7B, when a transfer cycle takes place for a time period of the serial addresses 0 to 127, the serial addresses 128 to 255 are subjected to transferring operation from the portion corresponding to the row R. When the serial access advances to 127 to enter the next SC cycle, the TAP address is accessed. Serial access is therefore continued further. As stated above, the split serial access memory section where serial access is carried out and the split serial access memory section where transfer is carried out are different from each other, and an address of the preceding cycle where an access to the TAP address is made is predetermined. Accordingly, restriction on the timings as in the case of FIGS. 6A and 6B does not exist.

Consideration will now be made of the method of constituting a data buffer for implementing high speed processing to display picture data using such a split transfer system.

As a random access memory of the DPRAM, a DRAM is used. For this reason, by using the page mode of DRAM, it is possible to access data of the same row in a time one half to one third of the time in the case where the row address changes. Further, the data of one row corresponds to data serially outputted from the SAM section, and the serial data serves as pixel data of a picture displayed. Therefore, how these pixels are arranged as a picture is important for high speed picture processing. From a viewpoint of processing a picture, employment of the method capable of processing, at a high speed, pixels in areas close to a square as much as possible permits high speed processing for any image pattern processing. Namely, high speed picture processing can be made in any direction of the longitudinal, lateral, or oblique directions. Thus, how data of one row which can be accessed in the page mode are allocated in a longitudinal direction with respect to the scanning direction of a picture displayed becomes important.

The case where a picture is composed of an array including four DPRAMs in a scanning direction and four DPRAMs in a longitudinal direction, i.e., an array of 4×4 is employed as a tile, will now be considered.

FIGS. 8A and 8B show the case where there is employed a DPRAM of the split transfer system having data of one row of 256 bits and the depth of a serial access memory (SAM) of 256 bits. Further, the picture size is assumed to be 1536 pixels in a scanning direction for brevity of explanation. In FIG. 8A, R0, R1, R2, ... represent rows of a random access memory (RAM), respectively. L of 0 to 127 and U of 128 to 255 in the column direction represent columns where data are transferred to bisected SAMs in the split transfer, respectively. Since the section in the scanning direction is composed of four devices $M_1$, $M_2$, $M_3$, and $M_4$, 1536 pixels in the scanning direction correspond to data corresponding to three split segmented SAMs (=1536/(4×128)). Accordingly, when L and U of the segmented SAMs are allocated to pixels in a longitudinal direction, it is possible to conduct picture processing of an area closer to a square by an access in a page mode of one row. Namely, data of the RAM section are subjected to a split transfer in the order of R0L, R1U, R2L, R0U, R1L, R2U, . . . Since data are serially outputted from the SAM section to scan pixels, the configuration of data as a picture is such that the area indicated by slanting lines of FIG. 8B is composed of data of the row R0. This area can be subjected to an access of any portion in the page mode. Accordingly, the picture is covered with tiles of slanting lines shown in FIG. 8B such that it can be accessed in the page mode. Thus, high speed picture processing can be conducted.

Further, more detailed consideration of the data configuration in the scanning direction will now be made. How pixels are constructed from serial data of four DPRAMs is shown in FIGS. 9A and 9B. Data from the SAM 2 of the devices M1 to M4 are subjected to parallel-to-serial conversion as shown in FIG. 9A, and are outputted as serial data to constitute pixels one by one. Thus, it is sufficient to make a serial access from SAM 2 at a speed one fourth that of the serial out for display of the picture, thus making it possible to lessen the load on the SAM 2. Pixel data when such a parallel-to-serial conversion is carried out, are repeated in sequence as data from the DPRAM of M1, M2, M3, and M4 in order (see FIG. 9B). The frame of R0L, etc. of the type which has been described with reference to FIG. 8B is of such a data structure.

Let us now consider the case where the picture size is different from that in the above-described case. The case where the number of pixels in a scanning direction is 1024 is shown in FIGS. 10A and 10B. When it is assumed that the size of a tile used is 4×4 in the same manner as that in the above-described case, 1024 pixels correspond to the two segmented SAM sections (=1024/(4×128)).

At this time, in order that L and U of split data of one row to correspond to the pixel arrangement in a longitudinal direction, it is necessary to carry out a split transfer in order as shown in FIG. 10A. Namely, when transfer is carried out in the order of R0L, R1U, R0U, R1L, . . . , the area indicated by slanting lines in FIG. 10B can be desirably accessed in the page mode. However, in the case of transfer at this time, L and U cross each other with respect to SAM. Accordingly, such a transfer cannot be carried out by a conventional DPRAM. Naturally, when the size of the tile is changed, a buffer can be constructed even for this picture size without cross transfer. However, the design of the buffer memory system must be changed for every picture size displayed. Further, since a cross transfer occurs unless the number of tiles in a scanning direction is necessarily odd as seen from the case of FIG. 8B, may not be possible to select an optimum tile size of a memory capacity which is not wasteful with respect to a picture size.

SUMMARY OF THE INVENTION

Accordingly, an object of this invention is to provide an image memory which has no necessity to vary a buffer memory system for every size of picture displayed.

According to the present invention, there is provided an image memory which includes a random access memory array capable of being randomly accessed; a serial access memory array partitioned into $2^n$(n>1) divisional areas cyclically and serially accessed asynchronously with the random access memory. A data transfer unit transfers data between the random access memory array and the serial access memory array. A determining unit determines a row of data to be transferred from the random access memory array to each of the divisional areas. A designating unit designated at least one of a top serial access address and a last serial access address respectively of each divisional area. The data transfer unit executes data transfer from the random access memory array to the serial access memory array in accordance with outputs from the determining unit and the designating unit.

According to the image memory of this invention, the determining unit determines the order of serial accesses to divisional areas of a serial access memory array and a row of data to be transferred from a random access memory array to each of the divisional areas in such a manner that tiles of a display screen are constituted by one row of the random access memory array. The designating unit designates at least one of a top serial access address and a last serial access address respectively of each divisional area. The data transfer unit transfers data between the random access memory array and the serial access memory array. With this arrangement of the image memory, it is possible to deal with various sizes of display screens without changing the buffer memory system.

Furthermore, in the image memory constructed according to the invention, the random access memory is partitioned into memory blocks. The determining unit determines the order of serial accesses to divisional areas partitioned into an n power of 2(n>1) of the serial access memory array and a row of data to be transferred from the random access memory array of each memory block in such a manner that tiles of a display screen are constituted by the data of the same rows of the memory blocks. The designating unit automatically designates at least one of a top serial access address and a last serial access address respectively of each divisional area. The data transfer unit transfers data between the random access memory array and the serial access memory array. With this arrangement of the image memory, it is possible to deal with various sizes of display screens without changing the buffer memory system.

BRIEF DESCRIPTION OF THE DRAWINGS

In the accompanying drawings.

FIGS. 4A and 4B are schematic diagrams used for explaining the method of processing tiles of the image memory according to the present invention, for the case where a display screen size cannot be filled in with tiles without leaving any space;

FIGS. 5A and 5B are schematic diagrams used for explaining the method of making the size of a tile fitted to a display screen size, by using the image memory of this invention;

DESCRIPTION OF THE PREFERRED EMBODIMENTS

Figure 1A:
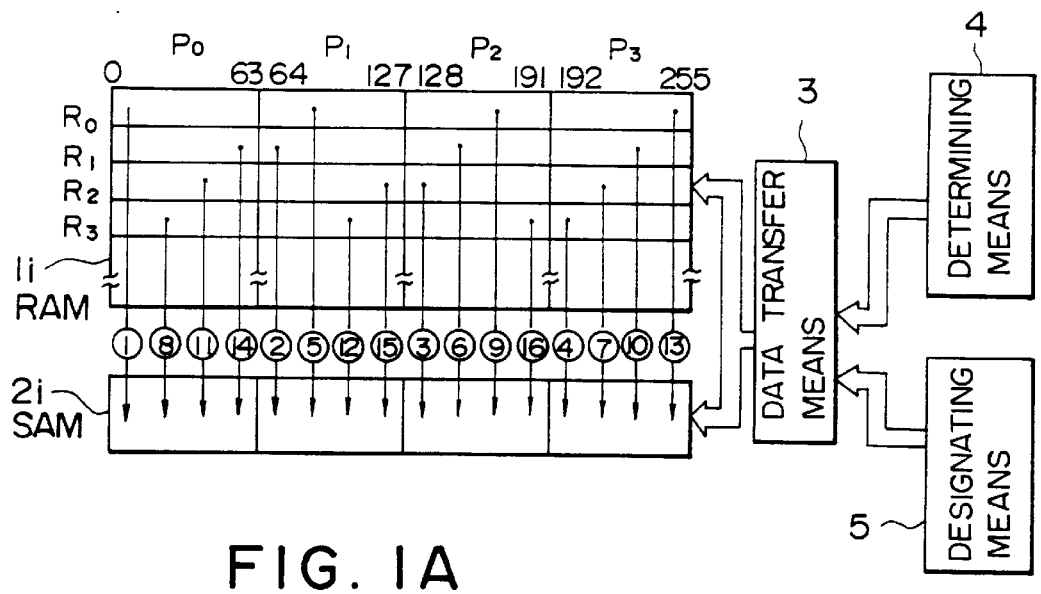
FIGS. 1A and 1B are schematic diagrams showing an embodiment of an image memory according to this invention.
Figure 1B:
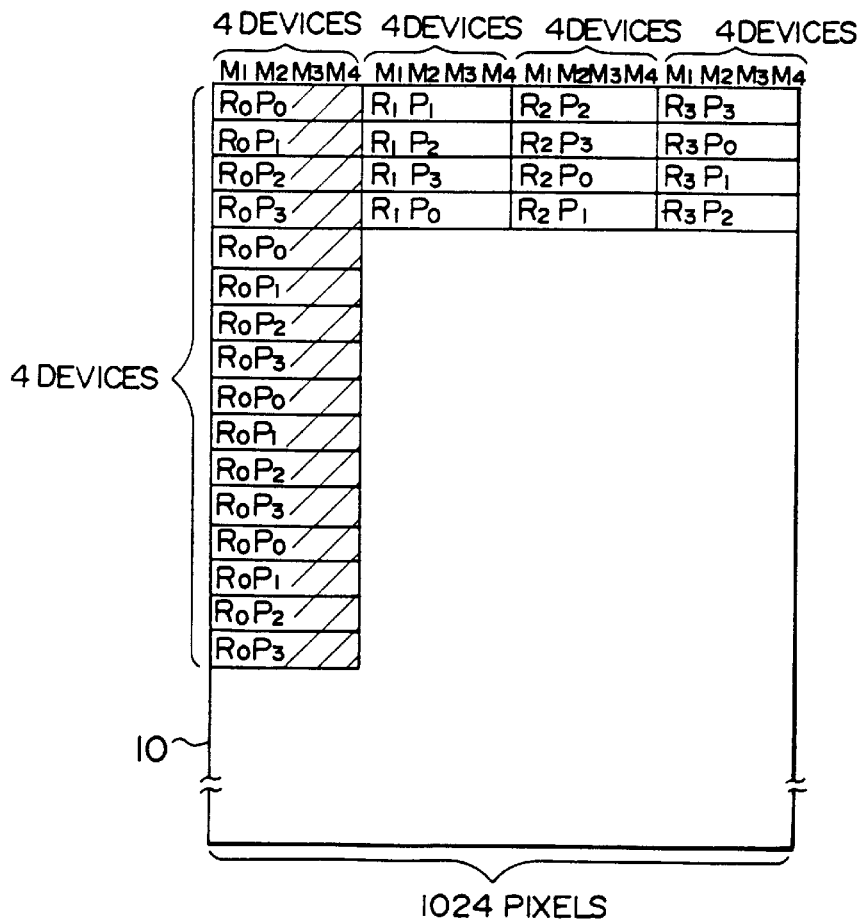

FIGS. 1A and 1B show an embodiment of an image memory according to the present invention. The image memory of this embodiment is constructed of 16 random access memory array devices $1i$ (i=0, . . . , 15), 16 serial access memory array devices $2i$ (i=0, . . . , 15), a data transfer unit 3, a determining unit 4, and a designating unit 5 (see FIG. 1A). The image memory stores display data to be displayed on a display screen 10 having 1024 pixels in the scan direction. Each SAM $2i$ is serially and cyclically accessed asynchronously with RAM $1i$. SAM $2i$ is partitioned into four divisional areas in this embodiment. The determining unit 4 determines the order of serial accesses to the divisional areas of SAMs $2i$ and the row of the data to be transferred from RAM $1i$ to the divisional areas so as to constitute one tile of the display screen 10 by one row of data of 16 RAMs $1_1, \ldots, 1_{16}$. The designating unit 5 designates the start or last serial access address of each divisional area of SAM $2i$. The data transfer unit 3 transfers data between RAM $1i$ and SAM $2i$ in accordance with the outputs from the determining unit 4 and designating unit 5.

Figure 9A:
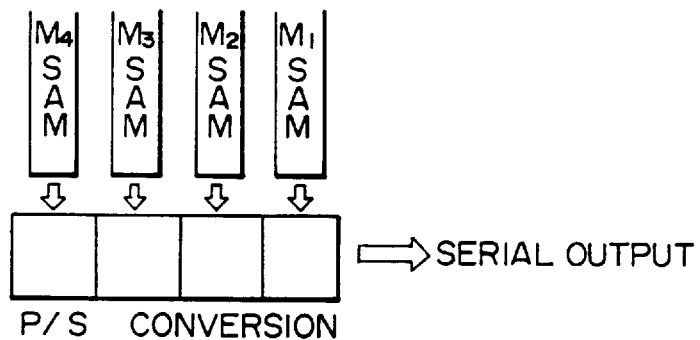
FIGS. 9A and 9B are explanatory views for describing the correspondence between the SAM port and pixels in a scanning direction of four devices.
Figure 9B:
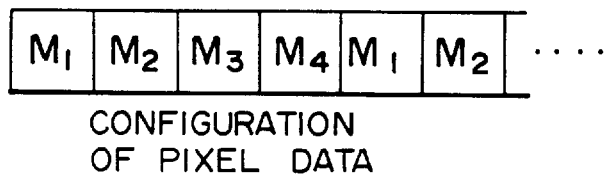
Figure 10A:
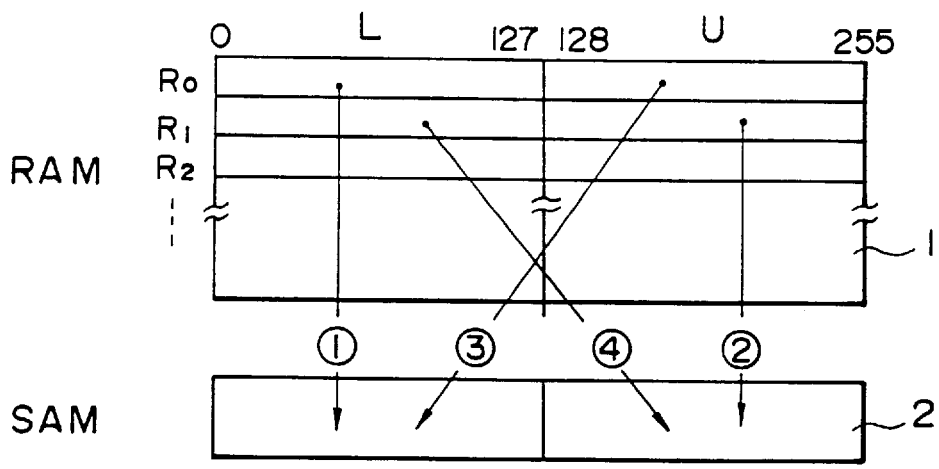
FIGS. 10A and 10B are explanatory views for describing the problem of a conventional image memory in the case where there is employed a conventional transfer method in which a pixel area close to a square as much as possible is accessible in a page mode cycle by the split transfer system.
Figure 10B:
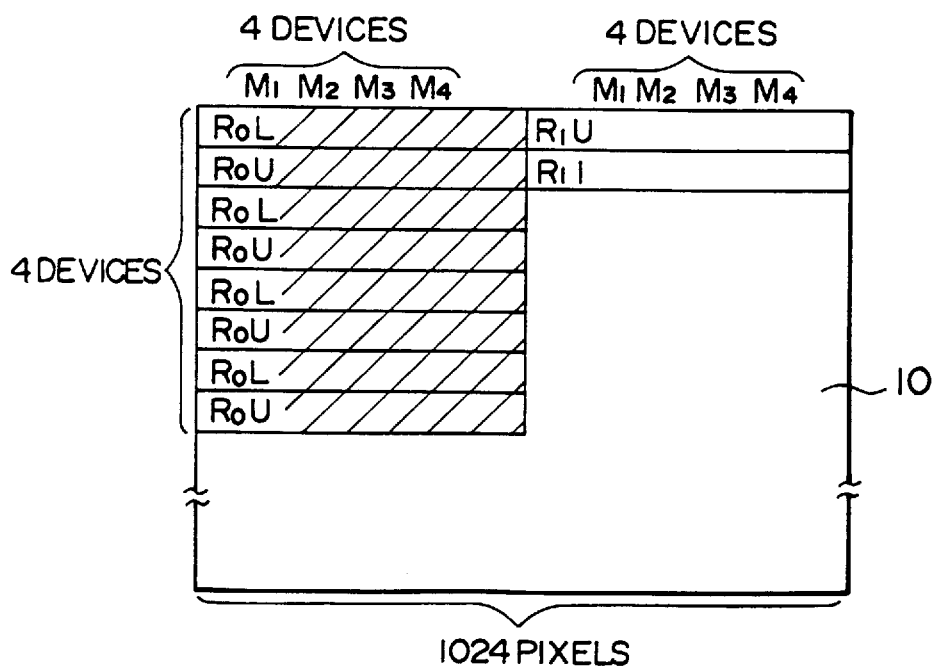

The operation of the above-described embodiment will be described below. The four divisional areas of SAM $2i$ in each row of RAM $1i$ are represented by four columns P0, P1, P2, and P3 each composed of 64 bits. The number of pixels 1024 in the scan direction of the display screen therefore corresponds to the number of bits of four (=1024/(4×64)) divisional areas of SAM $2i$. The determining unit 4 determines the order of data transfer from RAM $1i$ to SAM $2i$, for example, as R0P0, R1P1, R2P2, R3P3, R0P1, R1P2, R2P3, R3P0, R0P2, R1P3, R2P0, R3P1, R0P3, R1P0, R2P1, and R3P2. R0, R1, R2, and R3 represent the rows of RAM $1i$. Thus, R0P0 for example represents the column P0 of the row R0 of RAM $1i$. The designating unit 5 designates the start or last serial access address of each divisional area of SAM $2i$. However, in this example, the screen can be filled with tiles without leaving any space as described later, so that an output from the designating unit 5 can be neglected. As the order of data transfer from RAM $1i$ to SAM $2i$ is determined by the determining unit as described above, the data transfer unit 3 transfers data in accordance with this determined order. The data transfer from SAM $2i$ to the display screen is then carried out in the following manner. First, four R0P0 data transferred from RAM $1i$ (i=0, . . . , 3) to SAM $2i$ (i=0, . . . , 3) is serial-parallel converted and transferred to the display screen 10 as illustrated in FIGS. 9A and 9B. Thereafter, four RJPK data (J, K=0, . . . , 3) transferred from RAM $1i$ (i=4, . . . , 7) to SAM $2i$ (i=4, . . . , 7) is serial-parallel converted and transferred to the display screen 10, and this operation is repeated as many times as necessary. Similarly, in accordance with the data transfer order determined by the determining unit, data transferred from RAM $1i$ (i=4, . . . , 7) to SAM $2i$ (i=4, . . . , 7) is transferred to the display screen 10. Similar operation is repeated until data transferred from RAM $1i$ (i=12, . . . , 15) to SAM $2i$ (i=12, . . . , 15) has been transferred to the display screen 10. In the above manner, a tile (an area indicated by hatched lines in FIG. 1B) is constituted by the data corresponding to one row of 16 RAMs $1i$ (i=0, . . . , 15). Accordingly, this tile can be accessed at a high speed in a page mode. In the above embodiment, the size of the display screen 10 has been assumed to be 1024 pixels in the scan direction. Whatever the size of the display screen is, the pixels in the scan direction can be constituted by a suitable combination of 64 bit divisional areas of SAM $2i$. Furthermore, since data transfer can be controlled independently from each divisional area, it is not necessary to execute the cross split transfer.

Next, the situation where the screen cannot be filled in with tiles without leaving any space where it becomes necessary to precisely control TAP addresses designated by the designating means 5 for the data transfer to each divisional area, will be described.

Figure 2:
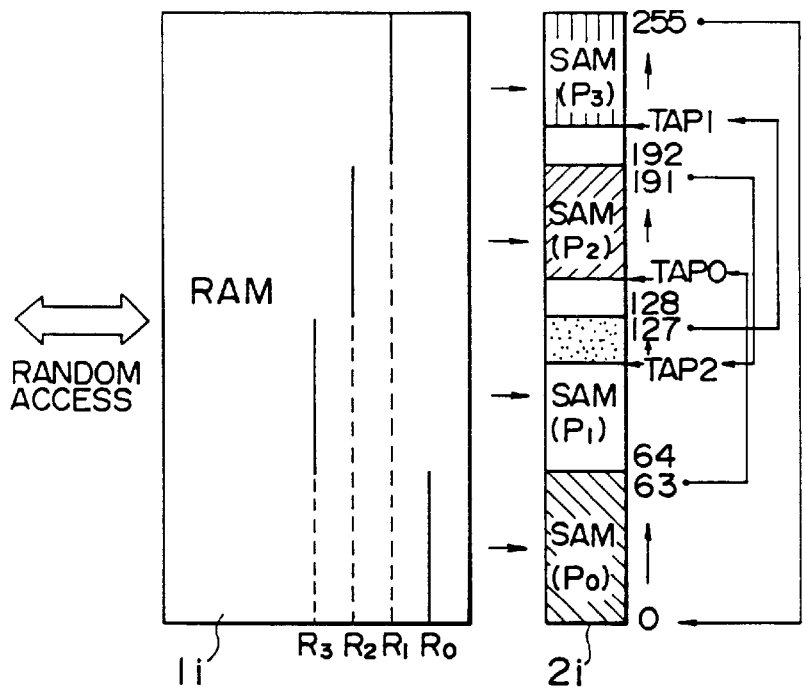
FIGS. 2 and 3 are schematic diagrams used for explaining the relationship between transfer data and TAP addresses.
Figure 3:
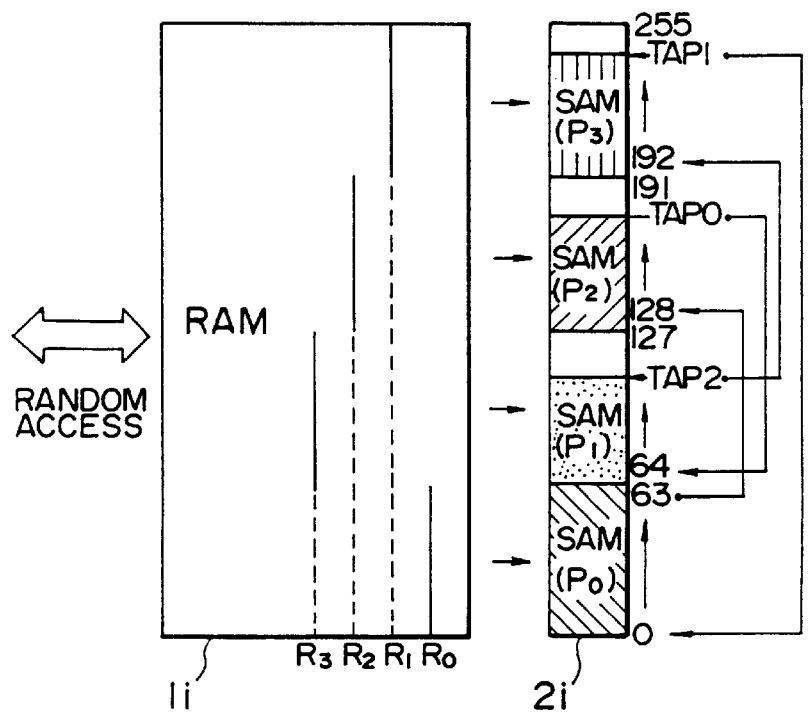
Figure 6A:
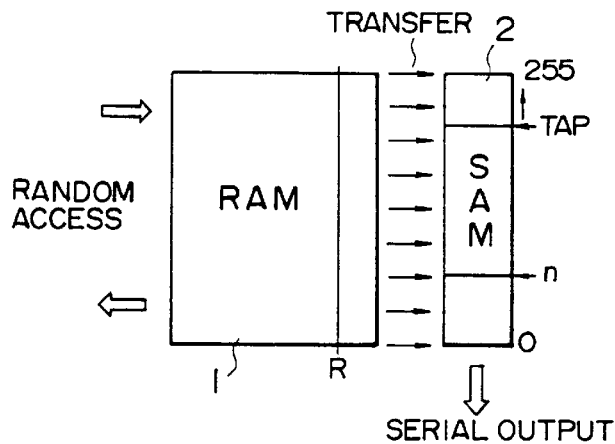
FIGS. 6A and 6B are explanatory views for describing a conventional image memory, respectively.
Figure 6B:
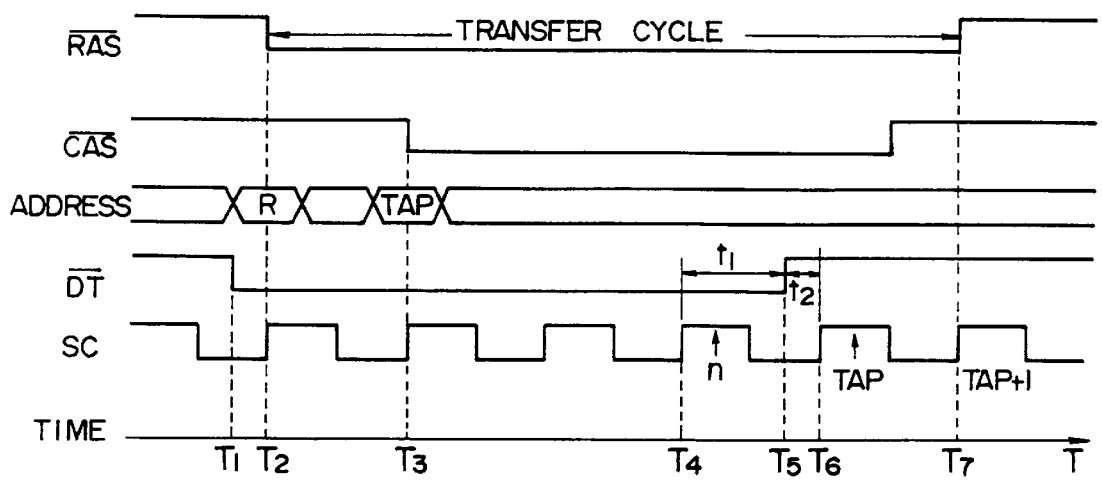
Figure 7A:
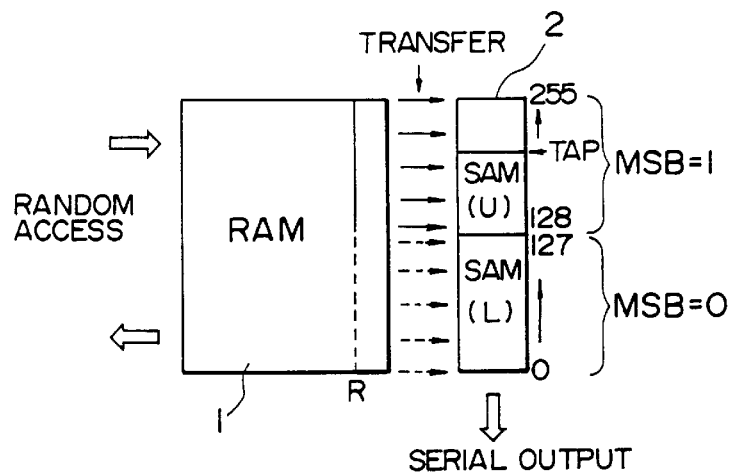
FIGS. 7A and 7B are explanatory views for describing a conventional split transfer system.
Figure 7B:
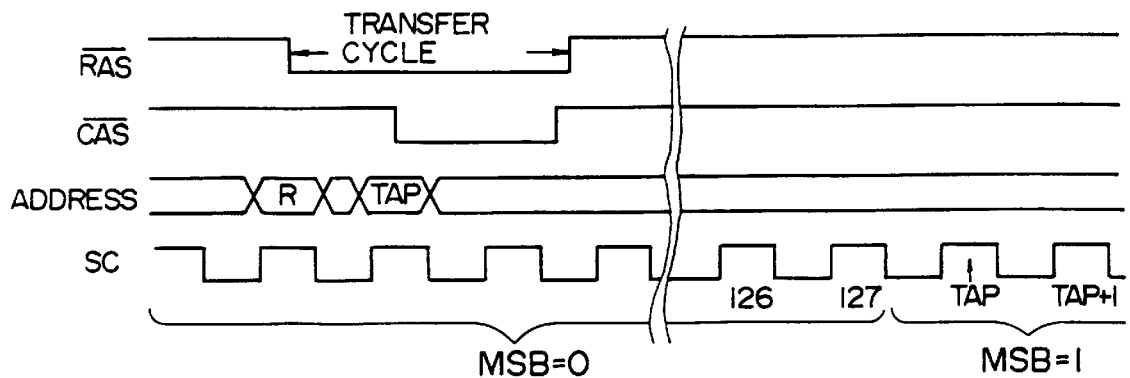
Figure 8A:
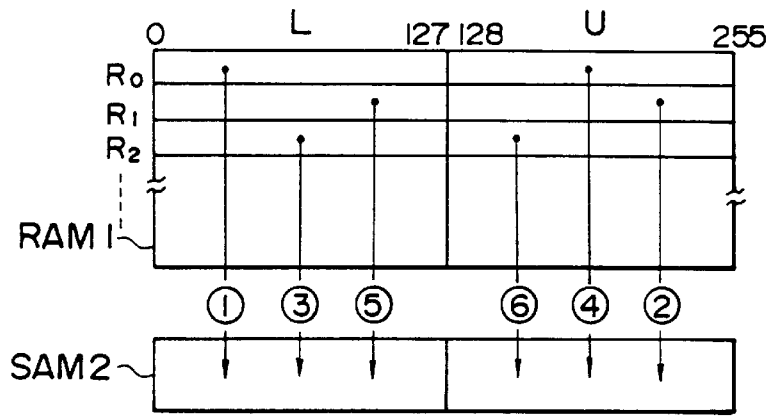
FIGS. 8A and 8B are explanatory views for describing a conventional transfer method in which a pixel area close to a square as much as possible is accessible in a page mode cycle by the split transfer system.
Figure 8B:
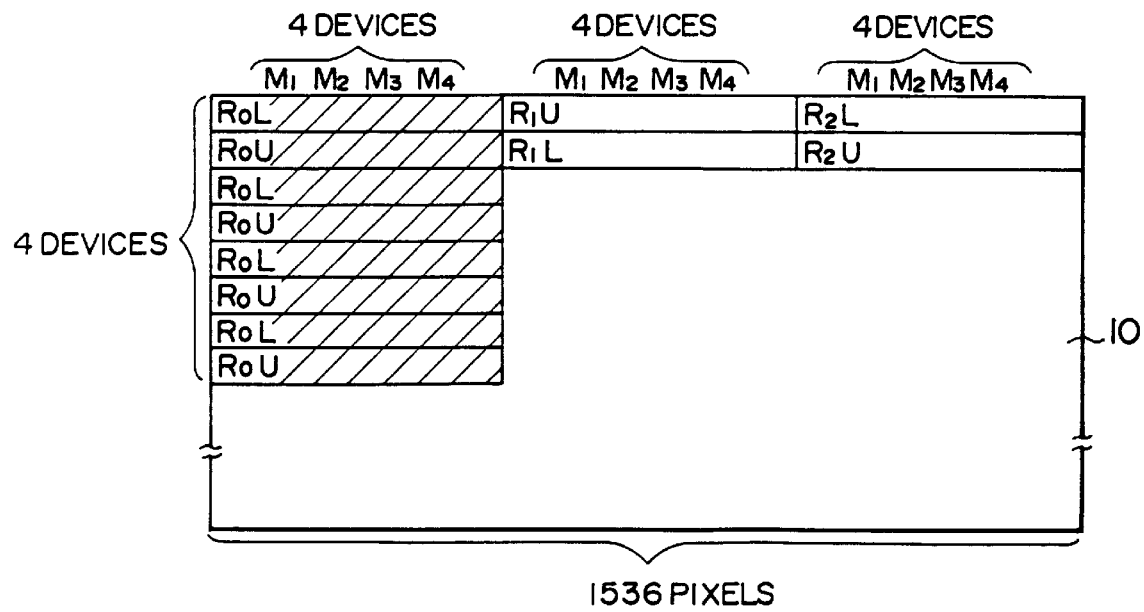

FIGS. 2 and 3 show examples of the relationship between the transfer data and TAP addresses. FIG. 2 illustrates the case where when an access to SAM $2i$ advances to a new divisional area, the top serial address of the new divisional area is indicated by a TAP address. While SAM (P0) having data already transferred from a row R0 and having serial addresses 0 to 63 is being accessed, if an instruction to transfer data from a row R2 is entered while designating a TAP 0 of SAM (P2), then data is transferred from the row R2 to SAM (P2) and after reading data up to the serial address 63, the serial address jumps to TAP 0. Next, while SAM (P2) having serial addresses TAP 0 to 191 is being accessed, if an instruction to transfer data from a row R3 is entered while designating a TAP 2 of SAM (P1), then data is transferred from the row R3 to SAM (P1) and after reading data up to the serial address 191, the serial address jumps to TAP 2. Next, while SAM (P1) having serial addresses TAP 2 to 127 is being accessed, if an instruction to transfer data from the row R1 is entered while designating a TAP 1 of SAM (P3), then data is transferred from the row R1 to SAM (P3) and after reading data up to the serial address 127, the serial address jumps to TAP 1. While SAM (P3) is being accessed, if there is no transfer instruction, after reading data up to the serial address 255, the serial address circulates back to the serial address 0.

FIG. 3 illustrates the case where when an access to SAM $2i$ advances to a new divisional area, the last serial address of the new divisional area is indicated by a TAP address. While SAM (P0) having data already transferred from a row R0 and having serial addresses 0 to 63 is being accessed, if an instruction to transfer data from a row R2 is entered while designating a TAP 0 of SAM (P2), then data is transferred from the row R2 to SAM (P2) and after reading data up to the serial address 63, the serial address jumps to an address 128. Next, while SAM (P2) having serial addresses 128 to TAP 0 is being accessed, if an instruction to transfer data from a row R3 is entered while designating a TAP 2 of SAM (P1), then data is transferred from the row R3 to SAM (P1) and after reading data up to the serial address TAP 0, the serial address jumps to an address 63. Next, while SAM (P1) having serial addresses 64 to TAP 2 is being accessed, if an instruction to transfer data from the row R1 is entered while designating a TAP 1 of SAM (P3), then data is transferred from the row R1 to SAM (P3) and after reading data up to the serial address TAP 2, the serial address jumps to an address 192. After the serial address TAP 1, the access circulates back to the serial address 0.

In the above description, either a top address or a last address is designated by a TAP address. It is understood that both addresses may be selectively designated at each data transfer. With the above TAP address control, it becomes possible to accommodate a display screen having an optional size. In the case where the display screen cannot be filled in with tiles without leaving any space in the scan direction as shown in FIGS. 4A and 4B, it becomes possible to make the number of pixels coincide with the number of serial accesses, by selecting suitable top TAP addresses for the last tile as shown in CASE 1 (refer to FIG. 4A) or by selecting suitable last TAP addresses for the last tile as shown in CASE 2 (refer to FIG. 4B). Alternatively, the size of tiles may be changed to fill tiles in a display screen without leaving any space, as shown in FIGS. 5A and 5B. It becomes possible to realize divisional areas of SAM $2i$ having a number of serial accesses coincident with the number of pixels of changed tiles, by selecting suitable top TAP addresses for the tiles as shown in CASE 1 (refer to FIG. 5A) or by selecting suitable last TAP addresses for the tiles as shown in CASE 2 (refer to FIG. 5B). The number of tiles in the scan direction in both the cases may be even or odd without any restriction, so that it is possible to use a memory capacity most suitable for a display screen size.

Lastly, the case where a TAP address designated during the transfer cycle is at the divisional area of SAM $2i$ which is now being serially accessed will be considered. In this case, the divisional area of SAM $2i$ under serial access is the same divisional area of SAM $2i$ to which data transfer is carried out. In order to avoid such conditions, one of the following three approaches is made.

(1) Timings of data transfer are synchronized, as conventional, to execute the transfer from RAM $1i$ to SAM $2i$ and the serial output from SAM $2i$.

(2) Transfer from RAM $1i$ to SAM $2i$ is neglected.

(3) As to the bits of a TAP address, the contents of bits designating a divisional area of SAM $2i$ are neglected, and the bits for the next divisional area to that of SAM $2i$ under serial access are set.

The next divisional area herein means a divisional area to be accessed next when there is no transfer cycle and the serial accesses are sequentially executed.

In the above description, SAM $2i$ has been partitioned into four divisional areas. It is understood that the number of divisions may take other n powers of 2 (n>1). As the number of divisions increases, the number of transfer gates will increase. The optimum number is therefore 4, 8, 16 and the like.

Furthermore, in the foregoing description, data at a row of RAM $1i$ is divisionally transferred to a divisional area of SAM $2i$. A divisional RAM $1i$ may be provided in correspondence with each divisional area of SAM $2i$. In such a case, although each divisional RAM $1i$ is designated by the same row address, data from each divisional RAM $1i$ is controlled to be selectively transferred. In this case, the bit structure of RAM $1i$ and SAM $2i$ becomes different (e.g.,×16 for RAM $1i$, and ×4 for SAM $2i$).

What is claimed is:

1. A method of reading out data from a video memory having:

a first random access memory array A1 having first to fourth rows, a second random access memory array A2 having fifth to eighth rows, a third random access memory array A3 having ninth to twelfth rows, and a fourth random access memory array A4 having thirteenth to sixteenth rows, each of said first to fourth random access memory arrays having a plurality of memory cells arranged in matrix form, cells at a same row of an array being accessed simultaneously; and a first serial access memory array B1, a second serial access memory array B2, a third serial access memory array B3, and a fourth serial access memory array B4, said first to fourth serial access memory arrays being provided corresponding to said first to fourth random access memory arrays respectively, and temporarily storing data corresponding to cells at one row of said random access memory arrays; said first to fourth random access memory arrays having input/output paths separately from said first to fourth serial access memory arrays;

said method comprising the steps of:
transferring data from the first row of A1 to B1;
transferring data from the sixth row of A2 to B2 while reading data from B1;
transferring data from the eleventh row of A3 to B3 while reading data from B2; and
reading data from B3.

2. A method of reading out data from a video memory having:

a first random access memory array A1 having first to fourth rows, a second random access memory array A2 having fifth to eighth rows, a third random access memory array A3 having ninth to twelfth rows, and a fourth random access memory array A4 having thirteenth to sixteenth rows, each of said first to fourth random access memory arrays having a plurality of memory cells arranged in matrix form, cells at a same row of an array being accessed simultaneously; and a first serial access memory array B1, a second serial access memory array B2, a third serial access memory array B3, and a fourth serial access memory array B4, said first to fourth serial access memory arrays being provided corresponding to said first to fourth random access memory arrays respectively, and temporarily storing data corresponding to cells at one row of said random access memory arrays; said first to fourth random access memory arrays having input/output paths separately from said first to fourth serial access memory arrays;

said method comprising the steps of:
transferring data from the fifth row of A2 to B2;
transferring data from the tenth row of A3 to B3 while reading data from B2;
transferring data from the fifteenth row of A4 to B4 while reading data from B3; and
reading data from B4.

3. A method of reading out data from a video memory having:

a first random access memory array A1 having first to fourth rows, a second random access memory array A2 having fifth to eighth rows, a third random access memory array A3 having ninth to twelfth rows, and a fourth random access memory array A4 having thirteenth to sixteenth rows, each of said first to fourth random access memory arrays having a plurality of memory cells arranged in matrix form, cells at a same row of an array being accessed simultaneously; and a first serial access memory array B1, a second serial access memory array B2, a third serial access memory array B3, and a fourth serial access memory array B4, said first to fourth serial access memory arrays being provided corresponding to said first to fourth random access memory arrays respectively, and temporarily storing data corresponding to cells at one row of said random access memory arrays; said first to fourth random access memory arrays having input/output paths separately from said first to fourth serial access memory arrays;

said method comprising the steps of:
transferring data from the ninth row of A3 to B3;
transferring data from the fourteenth row of A4 to B4 while reading data from B3;

transferring data from the third row of A1 to B1 while reading data from B4; and reading data from B1.

4. A method of reading out data from a video memory having:

a first random access memory array A1 having first to fourth rows, a second random access memory array A2 having fifth to eighth rows, a third random access memory array A3 having ninth to twelfth rows, and a fourth random access memory array A4 having thirteenth to sixteenth rows, each of said first to fourth random access memory arrays having a plurality of memory cells arranged in matrix form, cells at a same row of an array being accessed simultaneously; and a first serial access memory array B1, a second serial access memory array B2, a third serial access memory array B3, and a fourth serial access memory array B4, said first to fourth serial access memory arrays being provided corresponding to said first to fourth random access memory arrays respectively, and temporarily storing data corresponding to cells at one row of said random access memory arrays; said first to fourth random access memory arrays having input/output paths separately from said first to fourth serial access memory arrays;

said method comprising the steps of:

transferring data from the thirteenth row of A4 to B4;

transferring data from the second row of A1 to B1 while reading data from B4;

transferring data from the seventh row of A2 to B2 while reading data from B1; and reading data from B2.

5. A method of reading out data from a video memory having:

a first random access memory array A1 having first to fourth rows, a second random access memory array A2 having fifth to eighth rows, a third random access memory array A3 having ninth to twelfth rows, and a fourth random access memory array A4 having thirteenth to sixteenth rows, each of said first to fourth random access memory arrays having a plurality of memory cells arranged in matrix form, cells at a same row of an array being accessed simultaneously; and a first serial access memory array B3, a second serial access memory array B2, a third serial access memory array B3, and a fourth serial access memory array B4, said first to fourth serial access memory arrays being provided corresponding to said first to fourth random access memory arrays respectively, and temporarily storing data corresponding to cells at one row of said random access memory arrays; said first to fourth random access memory arrays having input/output paths separately from said first to fourth serial access memory arrays;

said method comprising the steps of:

transferring data from the first row of A1 to B1;

transferring data from the sixth row of A2 to B2 while reading data from B1;

transferring data from the eleventh row of A3 to B3 while reading data from B2;

transferring data from the sixteenth row of A4 to B4 while reading data from B3;

transferring data from the fifth row of A2 to B2 while reading data from B4; and reading data from B2.

6. A method of reading out data from a video memory having:

a first random access memory array A1 having first to fourth rows, a second random access memory array A2 having fifth to eighth rows, a third random access memory array A3 having ninth to twelfth rows, and a fourth random access memory array A4 having thirteenth to sixteenth rows, each of said first to fourth random access memory arrays having a plurality of memory cells arranged in matrix form, cells at a same row of an array being accessed simultaneously; and a first serial access memory array B1, a second serial access memory array B2, a third serial access memory array B3, and a fourth serial access memory array B4, said first to fourth serial access memory arrays being provided corresponding to said first to fourth random access memory arrays respectively, and temporarily storing data corresponding to cells at one row of said random access memory arrays; said first to fourth random access memory arrays having input/output paths separately from said first to fourth serial access memory arrays;

said method comprising the steps of:

transferring data from the fifth row of A2 to B2;

transferring data from the tenth row of A3 to B3 while reading data from B2;

transferring data from the fifteenth row of A4 to B4 while reading data from B3;

transferring data from the fourth row of A1 to B1 while reading data from B4;

transferring data from the ninth row of A3 to B3 while reading data from B1; and reading data from B3.

7. A method of reading out data from a video memory having:

a first random access memory array A1 having first to fourth rows, a second random access memory array A2 having fifth to eighth rows, a third random access memory array A3 having ninth to twelfth rows, and a fourth random access memory array A4 having thirteenth to sixteenth rows, each of said first to fourth random access memory arrays having a plurality of memory cells arranged in matrix form, cells at a same row of an array being accessed simultaneously; and a first serial access memory array B1, a second serial access memory array B2, a third serial access memory array B3, and a fourth serial access memory array B4, said first to fourth serial access memory arrays being provided corresponding to said first to fourth random access memory arrays respectively, and temporarily storing data corresponding to cells at one row of said random access memory arrays; said first to fourth random access memory arrays having input/output paths separately from said first to fourth serial access memory arrays;

said method comprising the steps of:

transferring data from the ninth row of A3 to B3;

transferring data from the fourteenth row of A4 to B4 while reading data from B3;

transferring data from the third row of A1 to B1 while reading data from B4;

transferring data from the eighth row of A2 to B2 while reading data from B1;

transferring data from the thirteenth row of A4 to B4 while reading data from B2; and reading data from B4.

8. A method of reading out data from a video memory having:

a first random access memory array A1 having first to fourth rows, a second random access memory array A2 having fifth to eighth rows, a third random access memory array A3 having ninth to twelfth rows, and a fourth random access memory array A4 having thirteenth to sixteenth rows, each of said first to fourth random access memory arrays having a plurality of memory cells arranged in matrix form, cells at a same row of an array being accessed simultaneously; and a first serial access memory array B1, a second serial access memory array B2, a third serial access memory array B3, and a fourth serial access memory array B4, said first to fourth serial access memory arrays being provided corresponding to said first to fourth random access memory arrays respectively, and temporarily storing data corresponding to cells at one row of said random access memory arrays; said first to fourth random access memory arrays having input/output paths separately from said first to fourth serial access memory arrays;

said method comprising the steps of:
   transferring data from the thirteenth row of A4 to B4;
   transferring data from the second row of A1 to B1 while reading data from B4;
   transferring data from the seventh row of A2 to B2 while reading data from B1;
   transferring data from the twelfth row of A3 to B3 while reading data from B2;
   transferring data from the first row of A1 to B1 while reading data from B3; and
   reading data from B1.

9. A video memory comprising:
a random access memory array, partitioned into N (N=$2^n$, n is an integer; N is an integer of 2 or greater) divisional RAM areas, each of said divisional RAM areas including a plurality of memory cells arranged in a matrix, cells at a same row of the matrix in a divisional RAM area being accessed simultaneously;
a serial access memory array partitioned into M (M=$2_m$, m is an integer greater than or equal to 2; M is an integer of 4 or greater) divisional SAM areas serially accessed asynchronously with respect to said random access memory array, each of said divisional SAM areas corresponding to one of said divisional RAM areas and temporarily storing data from cells of one row of said matrix of the divisional RAM areas; and
a data transfer unit to transfer data between a divisional RAM area of said random access memory array and a corresponding divisional SAM area of said serial access memory array,
wherein said random access memory array has input/output paths separately from said serial access memory array, and said serial access is executed by reading one divisional SAM area at one time, and when present reading reaches an end point of the divisional SAM area, a next reading is performed in another divisional SAM area, from an address which is designated during the present reading in the divisional SAM area.

10. A video memory comprising:
a random access memory array, partitioned into N (N=$2^n$, n is an integer; N is an integer of 2 or greater) divisional RAM areas, each of said divisional RAM areas including a plurality of memory cells arranged in a matrix, cells at a same row of the matrix in a divisional RAM area being accessed simultaneously;
a serial access memory array partitioned into M (M=$2^m$, m is an integer greater than or equal to 1; M is an integer of 2 or greater) divisional SAM areas serially accessed asynchronously with respect to said random access memory array, each of said divisional SAM areas corresponding to one of said divisional RAM areas and temporarily storing data from cells of one row of said matrix of the divisional RAM areas; and
a data transfer unit to transfer a block of data from a partitioned array of said random access memory array to a corresponding serial access memory array,
wherein said random access memory array has input/output paths separately from said serial access memory array, and said serial access is executed by reading one divisional SAM area at one time, and when present reading reaches an end point of the divisional SAM area, a next reading is performed in another divisional SAM area, from an address which is designated during the present reading in the divisional SAM area.

11. A video memory comprising:
a random access memory array, partitioned into N (N=$2^n$, n is an integer; N is an integer of 2 or greater) divisional RAM areas, each of said divisional RAM areas including a plurality of memory cells arranged in a matrix, cells at a same row of the matrix in a divisional RAM area being accessed simultaneously;
a serial access memory array partitioned into M (M =$_2$m, m is an integer greater than or equal to 2; M is an integer of 4 or greater) divisional SAM areas continuously accessed asynchronously with respect to said random access memory array, each of said divisional SAM areas temporarily storing data from cells of one row of said matrix of the divisional RAM areas; and
a data transfer unit to transfer data from a divisional RAM area of said random access memory array to a corresponding divisional SAM area of said serial access memory array, wherein said random access memory array has input/output paths separately from said serial access memory array, and said random access memory array is accessed independently of the serial access memory array, and serial access is executed by reading one divisional SAM area.

12. A method for reading data in a video memory, said video memory comprising:
a random access memory array, partitioned into N (N=$2^n$, n is an integer; N is an integer of 2 or greater) divisional RAM areas, each of said divisional RAM areas including a plurality of memory cells arranged in a matrix, cells at a same row of the matrix in a divisional RAM area being accessed simultaneously;
a serial access memory array partitioned into M (M=$2^m$, m is an integer greater than or equal to 2; M is an integer of 4 or greater) divisional SAM areas continuously accessed asynchronously with respect to said random access memory array, each of said divisional SAM areas temporarily storing data from cells of one row of said matrix of the divisional RAM areas; and
a data transfer unit to transfer data from a divisional RAM area of said random access memory array to a corresponding divisional SAM area of said serial access memory array,
wherein said random access memory array has input/output paths separately from said serial access memory array;
said method comprising:
   transferring data in one of said N divisional RAM areas to a corresponding one of M divisional SAM areas, and reading data in the divisional SAM areas where data has been transferred from a corresponding divisional RAM area, said reading being performed such that when present reading reaches an end point of the divisional SAM area, a next reading starts from an address in another divisional SAM area, which is designated during the present reading in the divisional SAM area.

13. The method according to claim 12, wherein SAM addresses where readings start are separately designated for divisional SAM areas.

14. A method for reading data in a video memory, said video memory comprising:

a random access memory array, partitioned into N (N=2$^n$, n is an integer; N is an integer of 2 or greater) divisional RAM areas, each of said divisional RAM areas including a plurality of memory cells arranged in a matrix, cells at a same row of the matrix in a divisional RAM area being accessed simultaneously;

a serial access memory array partitioned into M (M=2$^m$, m is an integer greater than or equal to 2; M is an integer of 4 or greater) divisional SAM areas continuously accessed asynchronously with respect to said random access memory array, each of said divisional SAM areas temporarily storing data from cells of one row of said matrix of the divisional RAM areas; and a data transfer unit to transfer data from a divisional RAM area of said random access memory array to a corresponding divisional SAM area of said serial access memory array, wherein said random access memory array has input/output paths separately from said serial access memory array, said method comprising:

transferring data in one of said N divisional RAM areas to a corresponding one of M divisional SAM areas, and reading data in the divisional SAM areas where data has been transferred from a corresponding divisional RAM area, and wherein said serial access of a divisional SAM area jumps to another divisional SAM area to start a new serial access when present serial access reaches an address which is a boundary.

15. The method according to claim 14, wherein SAM addresses where readings start are separately designated for divisional SAM areas.

16. A method for reading data in a video memory, said video memory comprising:

a random access memory array, partitioned into two divisional RAM areas, each of said divisional RAM areas including a plurality of memory cells arranged in a matrix, cells at a same row of the matrix in a divisional RAM area being accessed simultaneously;

a serial access memory array partitioned into four divisional SAM areas continuously accessed asynchronously with respect to said random access memory array, each of said divisional SAM areas temporarily storing data from cells of one row of said matrix of the divisional RAM areas; and a data transfer unit to transfer data from a divisional PAM area of said random access memory array to a corresponding divisional SAM area of said serial access memory array;

wherein said random access memory array has input/output paths separately from said serial access memory array, and wherein in said method said serial access of a divisional SAM area jumps to another divisional SAM area to start a new serial access when present serial access reaches an address which is a boundary.

17. The method according to claim 16, wherein SAM addresses where readings start are separately designated for divisional SAM areas.

18. A method for reading data in a video memory, said video memory comprising:

a random access memory array, partitioned into N (N=2$^n$, n is an integer; N is an integer of 2 or greater) divisional RAM areas, each of said divisional RAM areas including a plurality of memory cells arranged in a matrix, cells at a same row of the matrix in a divisional RAM area being accessed simultaneously;

a serial access memory array partitioned into M (M=2$^m$, m is an integer greater than or equal to 2; M is an integer of 4 or greater) divisional SAM areas continuously accessed asynchronously with respect to said random access memory array, each of said divisional SAM areas temporarily storing data from cells of one row of said matrix of the divisional RAM areas, each of said divisional SAM areas having its own start address; and a data transfer unit to transfer data from a divisional RAM area of said random access memory array to a corresponding divisional SAM area of said serial access memory array, wherein said random access memory array has input/output paths separately from said serial access memory array, said method comprising:

transferring data in one of said N divisional RAM areas to a corresponding one of M divisional SAM areas from its start address, and reading data in the divisional SAM areas where data has been transferred from a corresponding divisional RAM area, and wherein serial access of a divisional SAM area jumps to another divisional SAM area to start a new serial access when present serial access reaches an address which is a boundary.

* * * * *